(12) United States Patent
Lee

(10) Patent No.: US 6,242,809 B1
(45) Date of Patent: Jun. 5, 2001

(54) INTEGRATED CIRCUIT MEMORY DEVICES INCLUDING TITANIUM NITRIDE BIT LINES

(75) Inventor: Kyu-Pil Lee, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/274,707

(22) Filed: Mar. 23, 1999

(30) Foreign Application Priority Data

Mar. 25, 1998 (KR) .................................................. 98-10371

(51) Int. Cl.[7] .................................................. H01L 23/48
(52) U.S. Cl. .......................................... 257/764; 257/915
(58) Field of Search .................................. 257/915, 764

(56) References Cited

U.S. PATENT DOCUMENTS

| | | | |
|---|---|---|---|
| 5,208,470 | 5/1993 | Lee et al. | 257/296 |
| 5,214,603 | 5/1993 | Dhong et al. | 365/207 |
| 5,407,861 | 4/1995 | Marangon et al. | 437/192 |
| 5,534,730 | * 7/1996 | Mori et al. | 257/757 |
| 6,031,288 | 2/2000 | Todorobaru et al. | 257/754 |

FOREIGN PATENT DOCUMENTS 9-139475    5/1997   (JP) .

OTHER PUBLICATIONS

Notice to File Response, Korean Application No. 10–1998–0010371, Mar. 31, 2000.

* cited by examiner

*Primary Examiner*—Mark V. Prenty
(74) *Attorney, Agent, or Firm*—Myers Bigel Sibley & Sajovec

(57) ABSTRACT

Integrated circuit memory devices include a memory cell field effect transistor in an integrated circuit substrate, a conductive plug that electrically contacts the memory cell field effect transistor and a titanium nitride bit line that electrically contacts the conductive plug opposite the memory cell filed effect transistor. Titanium nitride also may be used to electrically contact field effect transistors in the peripheral region of the integrated circuit memory device. Titanium nitride can be used as a bit line metal instead of conventional tungsten, and as a conductive plug to contact both p[+]-type and n[+]-type source/drain regions in the peripheral region of the memory device. The titanium nitride conductive plugs and bit lines may be formed simultaneously.

3 Claims, 6 Drawing Sheets

US 6,242,809 B1

INTEGRATED CIRCUIT MEMORY DEVICES INCLUDING TITANIUM NITRIDE BIT LINES

FIELD OF THE INVENTION

This invention relates to integrated circuit memory devices and methods of fabricating the same, and more particularly to bit lines for integrated circuit memory devices and methods of fabricating the same.

BACKGROUND OF THE INVENTION

Integrated circuit memory devices are widely used in consumer and commercial applications. For example, Dynamic Random Access Memory (DRAM) devices are widely used memory devices. As is well known to those having skill in the art, a DRAM device memory cell generally includes a field effect transistor and a capacitor.

In order to increase the integration density of integrated circuit memory devices, it is generally desirable to decrease the cell area. Accordingly, for DRAMs, three-dimensional capacitor structures such as trench or stacked capacitors have been used. See, for example, U.S. Pat. No. 5,214,603 entitled Folded Bit Line, Ultra-High Density Dynamic Random Access Memory Having Access Transistors Stacked Above Storage Capacitors and U.S. Pat. No. 5,208,470 entitled Semiconductor Memory Device with a Stacked Capacitor. Stacked capacitor techniques have also been improved to further increase the surface area, for example, by providing cylindrical and fin-type capacitors. From a fabrication standpoint, DRAM devices may be classified into capacitor over bit line (COB) methods and structures wherein a capacitor is formed after forming the bit line, and capacitor under bit line (CUB) methods and structures wherein the capacitor is formed prior to forming the bit line.

Integrated circuit memory devices such as DRAM devices generally include a memory cell array region and a core and peripheral region outside the memory cell array region for logic devices and/or external input/output devices. The core and peripheral region will be referred to herein as the peripheral region.

The memory cell array region generally includes one or more arrays of memory cells. Each array generally includes a plurality of memory cells arranged in rows and columns. A plurality of generally orthogonal bit lines and word lines are employed to address individual memory cells in the array. Thus, a specified word line and a specified bit line can address a specific memory cell in a memory cell array for reading or writing. Sense amplifiers may be coupled to one or more bit lines to sense the data in a memory cell.

In order to provide high-speed integrated circuit memory devices, it is generally desirable to provide low resistance word lines and bit lines. FIG. 1 is a cross-sectional view of a conventional DRAM device wherein polycide is used as a bit line. As shown in FIG. 1, in fabricating a DRAM device, bit line wiring 10a in the cell array region and a contact plug 10b that contacts an underlying n+-type source/drain region 16 in the peripheral region may be simultaneously formed of polysilicon. Then, after forming capacitors 18, metal lines 12 are formed to contact the p+-type source/drain region 14, the n+-type source/drain regions and the doped polysilicon wiring 10b. As shown in FIG. 1, the topography of the cell array region and the peripheral region may differ, causing a large step therebetween. This may make it difficult to perform photolithography for the metal lines 12a in the peripheral region. Moreover, the polysilicon wiring may provide undesirably high resistance.

In order to further reduce the wiring resistance, it is known to employ a metal bit line instead of a conventional polysilicon, silicide or polysilicon/silicide bit line. For example, U.S. Pat. No. 5,407,861 entitled Metalization over Tungsten Plug describes a plug contact process wherein contact holes are etched and an ohmic/barrier metal layer such as titanium/titanium nitride and a filler metal such as tungsten are blanket deposited. Tungsten hexaflouride ($WF_6$) is used as a source gas for depositing the tungsten layer. The barrier metal layer is generally very thin, compared to the tungsten contact plug layer which generally is deposited to a thickness of greater than half the contact layer. In particular, the barrier metal layer may have thickness between several tens to several hundred Ångstroms. Accordingly, if the barrier metal layer does not function properly, for example due to poor step coverage, particularly at the bottom corner of a contact hole, the fluorine component of the tungsten hexaflouride gas may react with the titanium component of the barrier metal layer. As a result, an undesirable nonconductive material such as $TiF_x$ may be produced on the contact hole which can increase the contact resistance. Moreover, a lifting between the metal line and the source/drain region 16 also may take place, giving an incomplete electrical connection. Finally, depending on the process condition of the ohmic contact formation, the contact resistance between the metal material and the underlying layer also may vary.

In fabricating DRAM devices, a metal contact plug that contacts a p+-type source/drain region in the peripheral region is generally not formed simultaneously with the bit lines and the metal contact plugs that contact the n+-type source/drain regions in the peripheral region. This is because when tungsten is used for the bit line and the metal contact plug that contacts a source/drain region, the ohmic contact to the p+-type source/drain region may be damaged in a subsequent high temperature annealing process. In a COB structure, a high temperature anneal may take place during later deposition of a dielectric film. In a CUB structure, a high temperature anneal may take place during formation of an interlayer dielectric film, for example in depositing and reflowing borophosphosilicate glass (BPSG).

During the high temperature annealing process, dopants such as boron in the p+-type source/drain layer may be adsorbed into the overlying silicide layer to thereby form $TiB_x$. This may result in loss of boron in the source/drain regions, thereby increasing the depletion width and at least partially blocking electrical tunneling between the metal lines and the source/drain regions. Moreover, if the barrier metal layer does not function properly due to, for example, poor step coverage particularly at the bottom corner of the contact hole, the fluorine in the $WF_6$ gas that remains in the barrier layer or in the filler metal layer may react with the titanium component of the barrier metal layer. As a result, undesirable nonconductive material such as $TiF_x$ may be produced on the lower contact hole which can degrade contact resistance. For these and other reasons a metal bit line and wiring to a p+-type source/drain region generally are not formed simultaneously.

As indicated by the above discussion, as the integration density of integrated circuit memory devices continues to increase, there continues to be a need for structures and methods that can produce low contact resistance and can reduce the optical lithography process requirements.

SUMMARY OF THE INVENTION

It is therefore an object of the present invention to provide improved integrated circuit memory devices and methods of fabricating the same.

It is another object of the present invention to provide integrated circuit memory devices and fabrication methods than can reduce contact resistance.

It is still another object of the present invention to provide integrated circuit memory devices and fabrication methods than can simplify processing.

These and other objects are provided, according to the present invention, by integrated circuit memory devices that include a memory cell field effect transistor in an integrated circuit substrate, a conductive plug that electrically contacts the memory cell field effect transistor and a bit line comprising titanium nitride that electrically contacts the conductive plug opposite the memory cell filed effect transistor. Titanium nitride also may be used to electrically contact field effect transistors in the peripheral region of the integrated circuit memory device.

More specifically, titanium nitride can be used as a bit line metal instead of conventional tungsten, and as a conductive plug to contact both $p^+$-type and $n^+$-type source/drain regions in the peripheral region of the memory device. Moreover, the titanium nitride conductive plugs and bit lines may be formed simultaneously. The contact resistance between a conductive plug and a $p^+$-type source/drain region may be reduced by using titanium nitride as a conductive plug. Moreover, the contact resistance of the bit line may be reduced by utilizing titanium nitride bit lines. The process complexity also may be reduced by using titanium nitride as a bit line and as a conductive plug for source/drain regions of both conductivity types.

Integrated circuit memory devices according to the present invention comprise an integrated circuit substrate including a cell array region and a peripheral region. A first field effect transistor source/drain region of a first conductivity type is provided in the cell array region. A second field effect transistor source/drain region of the first conductivity type is provided in the peripheral region. A third field effect transistor source/drain of a second conductivity type is provided in the peripheral region. A first insulating layer is provided on the integrated circuit substrate and a first conductive plug is provided in the first insulating layer that electrically contacts the first field effect transistor source/drain region. A second insulating layer is provided on the first insulating layer and on the first conductive plug. The second insulating layer includes therein first, second and third contact holes on the first conductive plug and on the second and third field effect transistor source/drain regions, respectively. An optional silicide layer is provided on the first conductive plug and on the second and third field effect transistor source/drain regions. A conductive layer comprising titanium nitride is provided in the first, second and third contact holes that electrically contacts the silicide layers or electrically contacts the first conductive plug and the second and the second and third field effect transistor source/drain regions. The conductive layer in the first contact hole defines a bit line comprising titanium nitride for the integrated circuit memory device. The conductive layer in the second and third contact holes defines second and third conductive plugs comprising titanium nitride for the peripheral region.

In one embodiment, the conductive layer comprising titanium nitride fills the first, second and third contact holes. In another embodiment, the conductive layer comprising titanium nitride lines the first, second and third contact holes. The integrated circuit memory device further comprises a second conductive layer on the conductive layer comprising titanium nitride, that fills the lined first, second and third contact holes. The first conductive plug preferably comprises polysilicon and the second conductive layer preferably comprises tungsten.

Methods of forming integrated circuit memory devices according to the present invention form in an integrated circuit substrate, a first field effect transistor source/drain region of the first conductivity type in the cell array region thereof, a second field effect transistor source/drain region of the first conductivity type in the peripheral region thereof and a third field effect transistor source/drain region of the second conductivity type in the peripheral region thereof. A first insulating layer is formed on the integrated circuit substrate. A first conductive plug is formed in the first insulating layer that electrically contacts the first field effect transistor source/drain region. A second insulating layer is formed on the first insulating layer and on the first conductive plug.

First, second and third contact holes are formed that electrically contact the first conductive plug and the second and third field effect transistor source/drain regions, respectively. An optional silicide layer is formed on the first conductive plug and on the second and third field effect transistor source/drain regions. A patterned conductive layer is then simultaneously formed in the first, second and third contact holes that electrically contacts the silicide layers or the first conductive plug and the second and third field effect transistor source/drain regions. The patterned conductive layer in the first contact hole defines a bit line for the integrated circuit memory device. The patterned conductive layer in the second and third contact holes defines second and third conductive plugs for the peripheral region.

As described above, the patterned conductive layer may fill the first, second and third contact holes. Alternately, the patterned conductive layer may line the first, second and third contact holes and a second patterned conductive layer may be provided that fills the lined first, second and third contact holes. The patterned conductive layer preferably comprises titanium nitride, the first contact plug preferably comprises polysilicon and the second patterned conductive layer preferably comprises tungsten. The second conductive layer preferably is thinner than the first conductive layer. A capacitor may then be formed on the second insulating layer to thereby form a DRAM device.

Accordingly, titanium nitride may be used to provide a bit line and wiring to both p-type and n-type source/drain regions. Moreover, the bit line and wiring to the p-type and n-type source/drain regions may be formed simultaneously. Improved processes for forming integrated circuit memory devices with low wiring resistance may be provided.

DETAILED DESCRIPTION OF PREFERRED EMBODIMENTS

Figure 1:
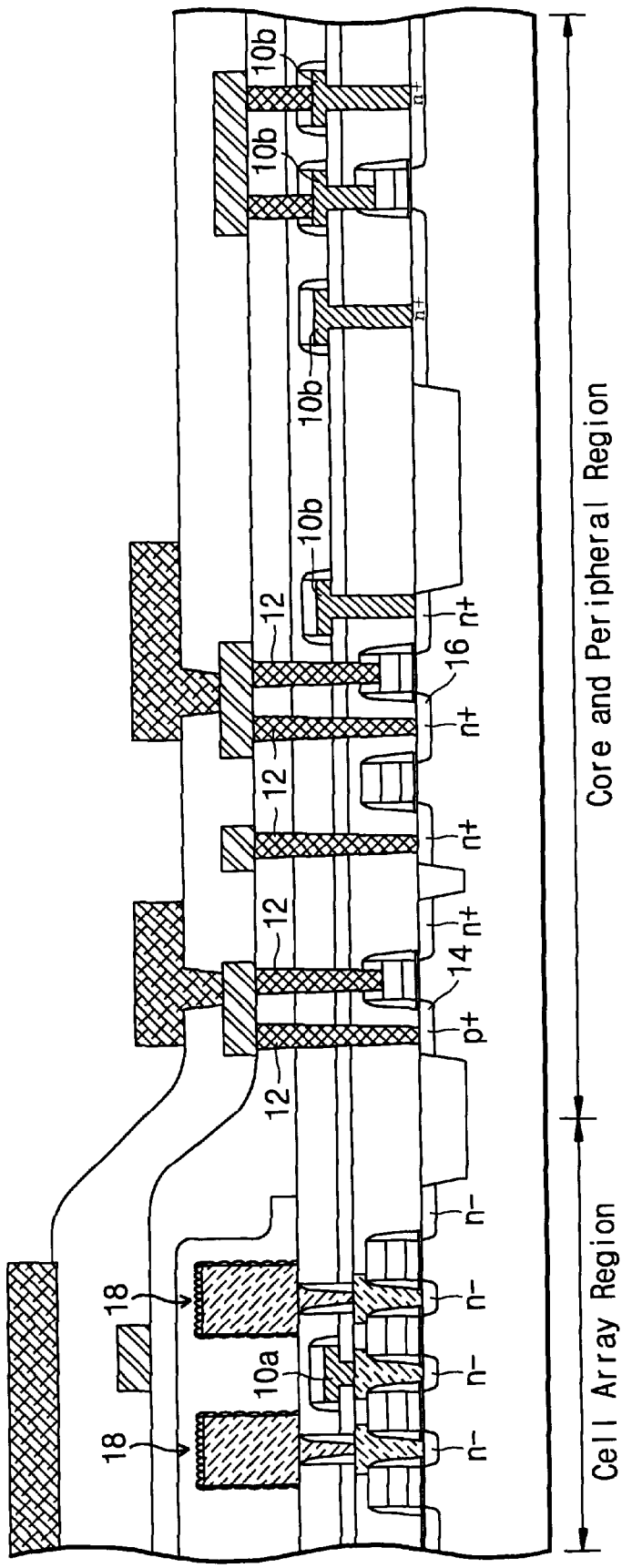
FIG. 1 is a cross-sectional view of a conventional DRAM device.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 2A:
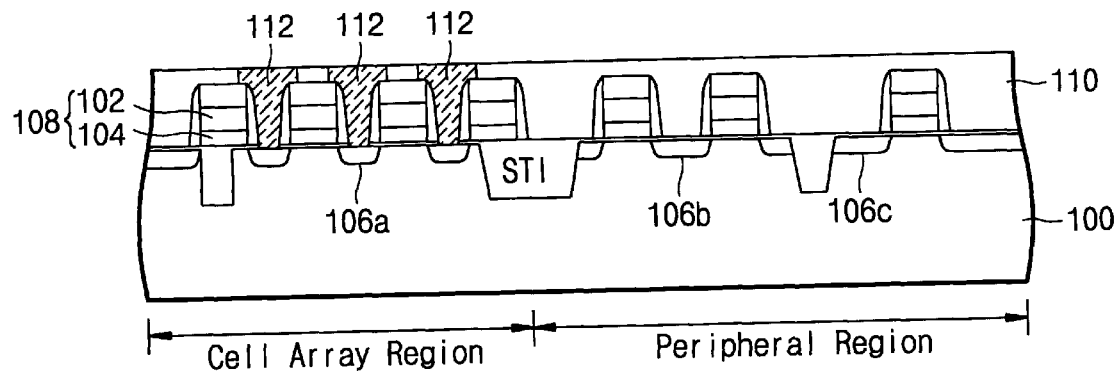
FIGS. 2a–2e are cross-sectional views of integrated circuit memory devices according to the present invention during intermediate fabrication steps.

Referring now to FIG. 2a, a field oxide layer such as a shallow trench isolation (STI) layer is formed in an integrated circuit substrate 100 such as a silicon semiconductor substrate to define a cell array region and a peripheral region thereof. A plurality of gate electrodes 108 are formed. The gate electrodes comprise a gate insulator, a metal silicide layer 104, a polysilicon layer 102, a capping layer and sidewalls, and may be formed using techniques well known to those having skill in the art. A plurality of source/drain regions are formed, for example using ion implantation, to thereby form a plurality of field effect transistors. Briefly, $n^-$-type source/drain regions 106a may be formed by implanting n-type dopants into the integrated circuit substrate using the gate electrodes 108 as a mask. A plurality of sidewall spacers may be formed on the gate electrodes 108 using conventional techniques. Then, using selective ion implantation, n-type and p-type impurities are implanted into the peripheral region using the gates as a mask to provide $p^+$-type source/drain regions 106b in the peripheral region and $n^+$-type source/drain regions 106c in the peripheral region. Other techniques may be used to fabricate the field effect transistors.

Still referring to FIG. 2a, a first interlayer insulating layer 110, for example comprising silicon dioxide, is formed on the integrated circuit substrate 100. The first interlayer insulating layer 110 is then etched to form contact holes which expose the $n^-$-type source/drain regions 106a. The contact holes may then be filled with conductive material such as polysilicon and patterned to form contact pads 112, also referred to as first conductive plugs 112, that contact the n-type source/drain regions 106 in the cell array region. In DRAMs with more than a gigabit scale, the contact holes may have a width of less than 0.2 $\mu$m.

Figure 2B:
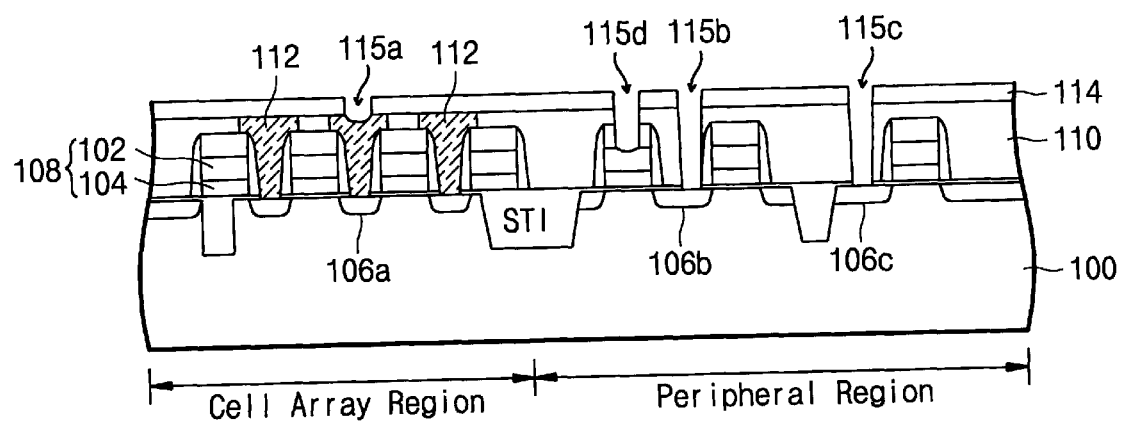

Referring now to FIG. 2b, a second interlayer insulating layer 114 is formed on the first interlayer insulating layer 110 and on the contact pads 112. Contact holes 115a, 115b, 115c and 115d are opened in the interlayer insulating layers 110 and 114 to expose a contact pad 112 in the cell array region and a $p^+$-type source/drain region 106b, an $n^+$-type source/drain region 106c and a gate electrode 108 in the peripheral region, respectively. In order to stabilize the ohmic contact with the contact pad 112, the source/drain regions 106b and 106c and the overlying metal wiring to be formed, an optional ion implementation may be carried out at doses that range from about 1E13 atoms/cm$^2$ to about 1E15 atoms/cm$^2$ and with an energy of several to several hundred KeV. For example, p-type dopants may be implanted into the p-type source/drain regions 106b and n-type dopants may be implanted into n-type source/drain regions 106a and 106c. An anneal may then be carried out to activate the implanted impurities. The anneal may be carried out by rapid thermal processing so as to maximize effective channel length.

Figure 2C:
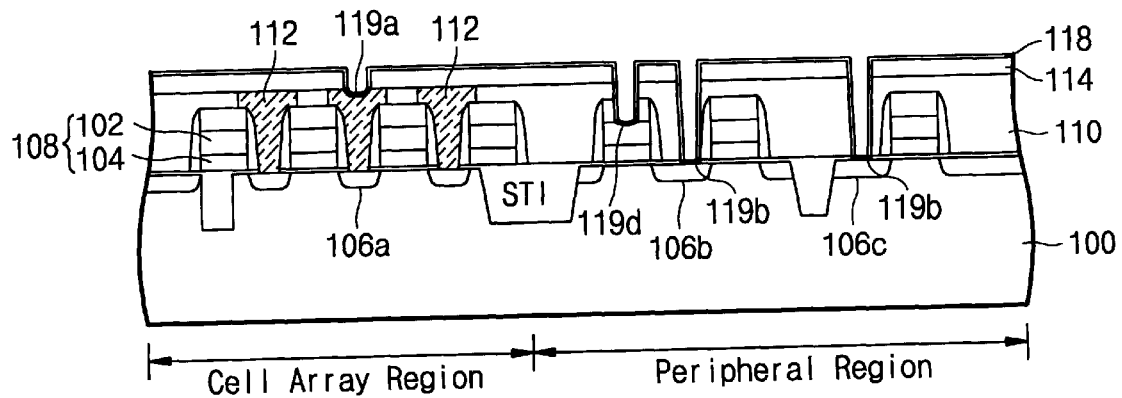

Referring now to FIG. 2c, a first metal layer 118 is conformally deposited on the second interlayer insulating layer 114 and in the contact holes 115a, 115b and 115c, for example at a thickness of between about 200 Å to about 500 Å. Titanium and/or cobalt and/or other metals may be used. An anneal is then performed at temperatures between about 500° C. to about 1,000° C. to thereby form a metal silicide layer 119a, 119b, 119c and 119d at the bottom of the contact holes 115a, 115b, 115c and 115d respectively. Sulfuric acid stripping optionally may then be used to remove the remaining titanium layer 118 which does not form a silicide. It will also be understood that the formation of the silicide layer is optional, and the silicide layer may be formed using other conventional silicide forming techniques.

Figure 2D:
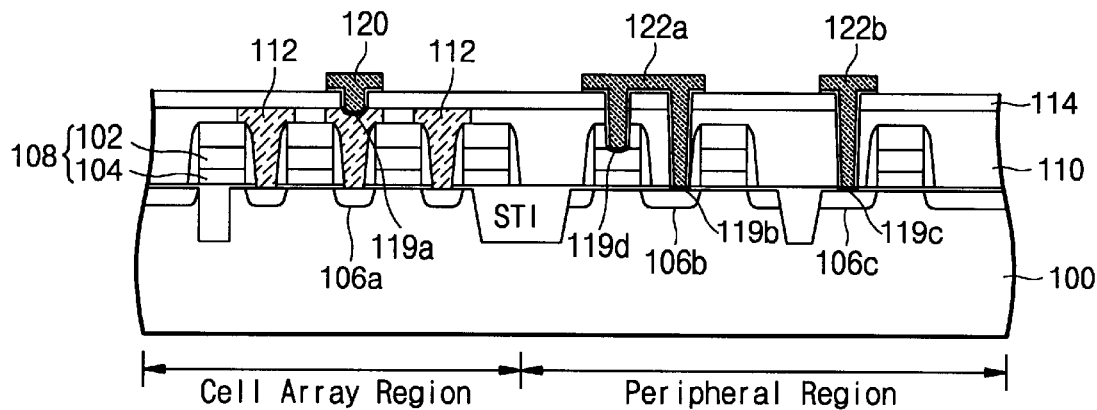

Referring now to FIG. 2d, a second metal layer comprising titanium nitride (TiN) is blanket deposited on the second interlayer insulating layer 114, filling the contact holes 115a, 115b, 115c and 115d. The titanium nitride layer may be deposited at a thickness of between about 2000 Å to about 5000 Å. The thickness of the titanium nitride layer may be varied depending on the width of the contact holes 115a, 115b, 115c and 115d. Photolithography may then be carried out to pattern the titanium nitride layer and the remaining titanium layer 118 thereunder, if present, and thereby simultaneously form a bit line 120 comprising titanium nitride in the cell array region and second and third conductive plugs 122a and 122b that electrically contact a $p^+$-type source/drain region 106b and an $n^+$-type source/drain region 106c in the peripheral region.

As shown in FIG. 2d, the bit line 120 and the second and third conductive plugs 122a and 122b are formed simultaneously from a layer comprising titanium nitride. Lifting that is conventionally encountered with tungsten bit lines may be reduced. The contact resistance of the bit line and of the metal wiring to n-type source/drain regions and p-type source/drain regions also may be reduced.

Figure 2E:
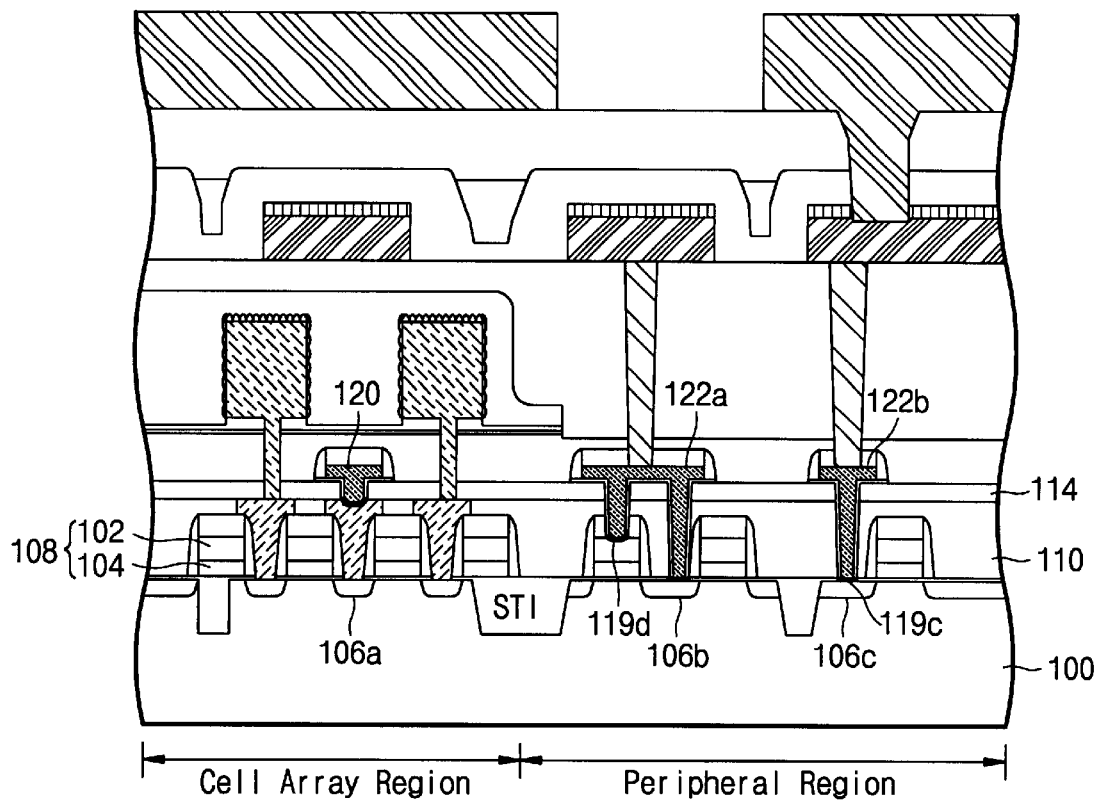

Referring now to FIG. 2e, conventional processing may then be used to form a capacitor and metal wiring to thereby form a DRAM device having a COB structure. Other conventional processing steps may be used to form other conventional DRAM devices or other integrated circuit memory devices.

Figure 3:
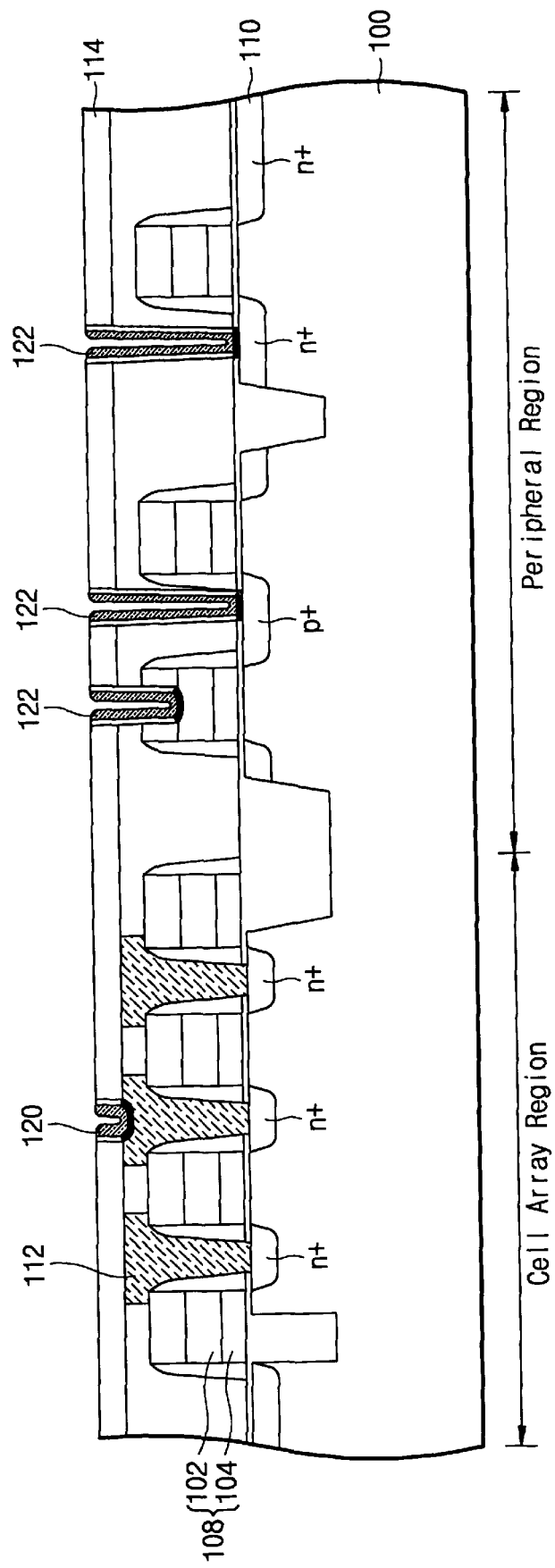
FIG. 3 is a cross-sectional view of integrated circuit memory devices according to another embodiment of the present invention.

FIG. 3 illustrates an alternate embodiment of FIG. 2d. In contrast to FIG. 2d, the titanium nitride layer 120 and the titanium nitride conductive plugs 122 in the peripheral region do not fill the contact holes. Rather, the titanium nitride layer lines the contact holes, and a void is formed within the contact holes as shown in FIG. 3. Preferably, the thickness of the titanium nitride layers 120 and 122 in the contact holes is more than half of the void width.

Figure 4A:
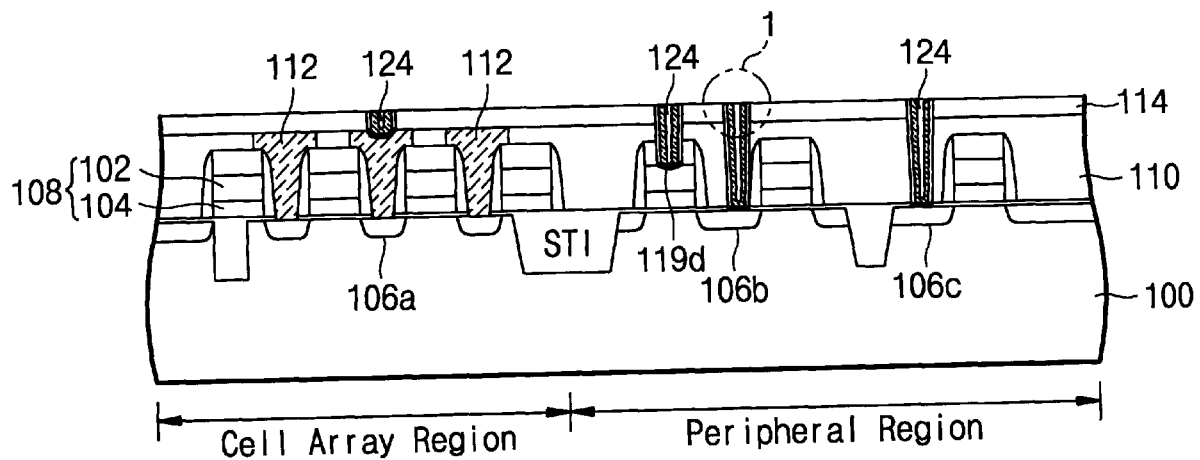
FIGS. 4 and 5 are cross-sectional views of two embodiments of subsequent fabrication steps for integrated circuit memory devices of FIG. 3.
Figure 4B:
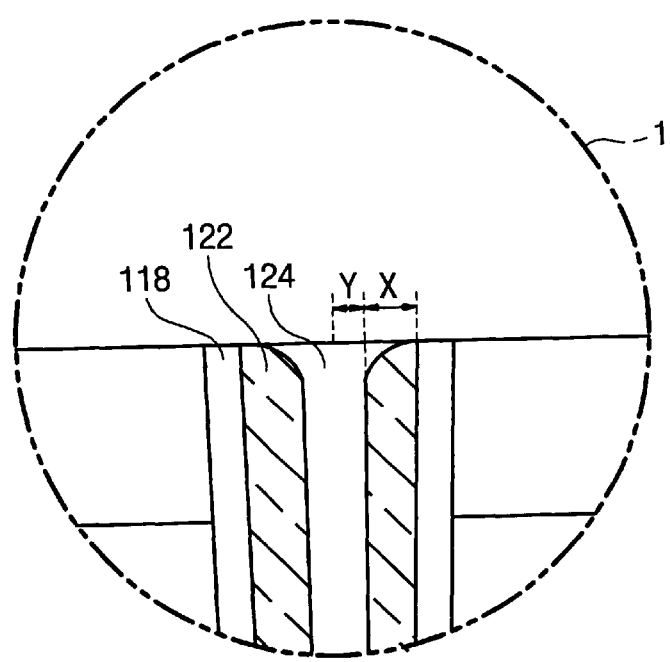

Then, as shown in FIG. 4, tungsten is deposited on the second interlayer insulating layer 114 at a thickness that preferably is less than the titanium nitride layer 120 and the titanium nitride conductive plugs 122, to thereby completely fill the lined contact holes. The tungsten layer is then etched back to form a tungsten layer 124 in the second and third conductive plugs and in the bit line. As shown in FIG. 4, the thickness of the titanium nitride layer shown as "X" is greater than that of the tungsten layer 124 shown as "Y".

Figure 5A:
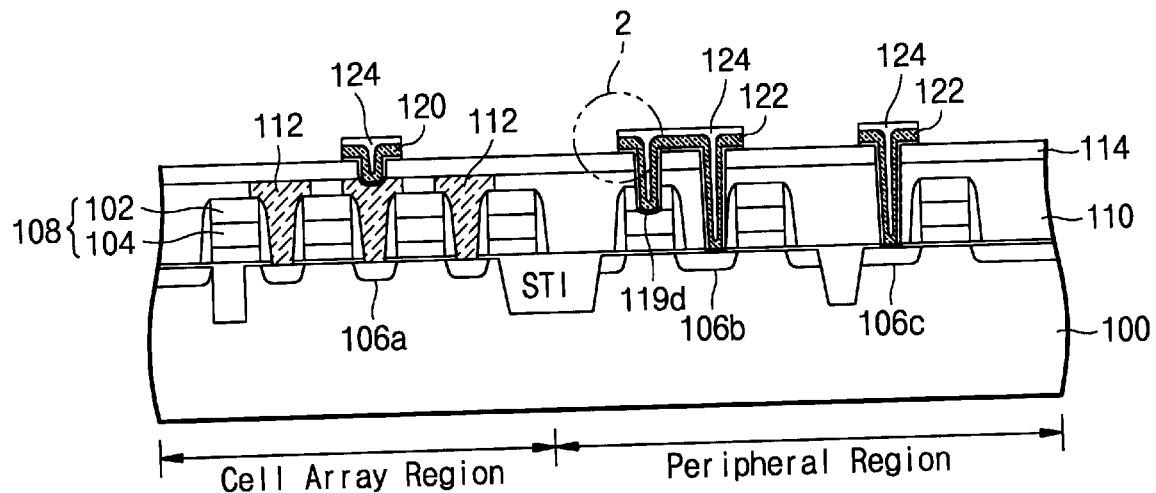
Figure 5B:
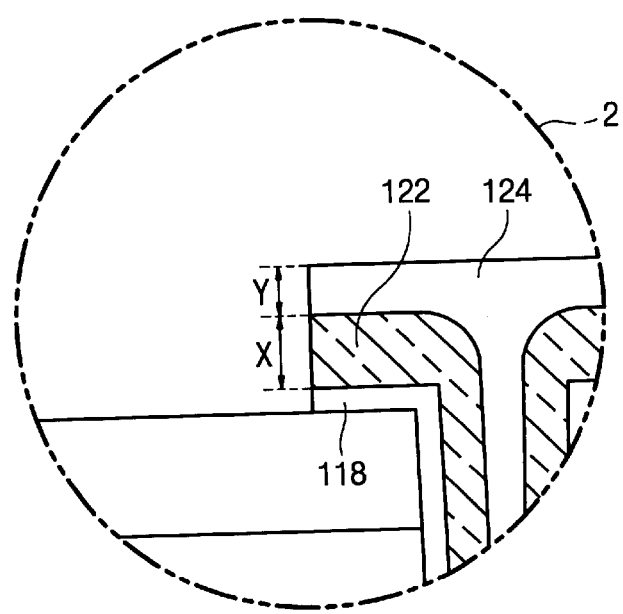

Alternatively, as shown in FIG. 5, the step of etching back the tungsten layer may be skipped. Then, the titanium nitride layer 120 and the titanium nitride conductive plugs 122 and the tungsten layer 124 both may be patterned simultaneously to form a bit line and wiring layers which comprise titanium nitride layers and tungsten layers. Again as shown, the thickness "X" of the titanium nitride layer preferably is greater than the thickness "Y" of the tungsten layer 124.

Accordingly, the present invention can provide reduced contact resistance using a titanium nitride layer. Lifting phenomena may be reduced and the process may be simplified.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device comprising:
    an integrated circuit substrate including a cell array region and a peripheral region;
    a first field effect transistor source/drain region of a first conductivity type in the cell array region;
    a second field effect transistor source/drain region of the first conductivity type in the peripheral region;
    a third field effect transistor source/drain region of a second conductivity type in the peripheral region;
    a first insulating layer on the integrated circuit substrate;
    a first conductive plug in the first insulating layer that electrically contacts the first field effect transistor source/drain region;
    a second insulating layer on the first insulating layer and on the first conductive plug, the second insulating layer including therein first, second and third contact holes on the first conductive plug, and on the second and third field effect transistor source/drain regions, respectively; and
    a first titanium nitride plug in the first contact hole that electrically contacts the first conductive plug, and second and third titanium nitride plugs for the peripheral region that electrically contact the second and third field effect transistor source/drain regions respectively, the first titanium nitride plug in the first contact hole defining a bit line for the integrated circuit memory device.

2. An integrated circuit memory device according to claim 1 wherein the first, second, and third titanium nitride plugs entirely fill the first, second and third contact holes respectively.

3. An integrated circuit memory device according to claim 1 further comprising a single metal layer that lines the first, second, and third contact holes, respectively.

* * * * *